United States Patent [19]
Elliott et al.

[11] Patent Number: 6,032,997
[45] Date of Patent: Mar. 7, 2000

[54] VACUUM CHUCK

[75] Inventors: David J. Elliott, Wayland, Mass.;
George D. Whitten, Stewart, Fla.

[73] Assignee: Excimer Laser Systems, Wayland, Mass.

[21] Appl. No.: 09/061,398

[22] Filed: Apr. 16, 1998

[51] Int. Cl.$^7$ ............................. B25J 15/06; B25J 19/02
[52] U.S. Cl. .................. 294/64.1; 294/902; 294/907; 414/941; 901/40; 901/47; 269/21
[58] Field of Search ................................. 294/64.1, 64.2, 294/64.3, 65, 902, 907; 901/40, 47; 414/941; 269/21; 279/3

[56] References Cited

U.S. PATENT DOCUMENTS

| | | | |
|---|---|---|---|
| 2,883,799 | 4/1959 | Wynne et al. . | |
| 3,467,430 | 9/1969 | Lowe | 294/64.1 |
| 3,554,725 | 1/1971 | Bracken et al. . | |
| 3,608,946 | 9/1971 | Erickson et al. | 294/64.1 |
| 4,024,835 | 5/1977 | Scheu et al. . | |
| 4,526,445 | 7/1985 | Wogoman | 269/21 |
| 4,551,192 | 11/1985 | DiMilia et al. . | |
| 4,752,682 | 6/1988 | Beck et al. | 901/47 |
| 4,794,094 | 12/1988 | Makishima et al. . | |
| 4,822,278 | 4/1989 | Oliva et al. | 294/64.1 |
| 4,904,291 | 2/1990 | Siebers et al. . | |
| 5,033,783 | 7/1991 | Izumi et al. | 294/64.1 |
| 5,043,003 | 8/1991 | Omi et al. . | |
| 5,534,073 | 7/1996 | Kinoshita et al. | 269/21 |
| 5,564,682 | 10/1996 | Tsuji | 269/21 |
| 5,857,667 | 1/1999 | Lee | 269/21 |

FOREIGN PATENT DOCUMENTS 1611-733  12/1990  U.S.S.R. .................. 901/47

OTHER PUBLICATIONS

Alpha Alignment Mark Photoablation System (Sep.–1996).
Semiconductor International, Dec. 1986 "Litography Trends".
Very Large Scale Integrated pattern registration improvement by photoablation of resist–covered alignment targets, Polaski, Elliot, Piwczyk, 1988.
Deformation of X–ray Lithography Masks During Tool Chucking, Chen, Alek C. (no date).
Characterization of Stepper Chuck Performance, Goodall, Alvarez (no date).
Electrostatic wafer clamping for next–generation manufacturing, Field, Solid State Technology, 1994.
Film/substrate/vacuum–chuck interactions during spin-–coating, Birnie et al., Optical Engineering, 1992.

*Primary Examiner*—Dean J. Kramer
*Attorney, Agent, or Firm*—Iandiorio & Teska

[57] ABSTRACT

A vacuum chuck having a body portion made of moldable glass or another suitable dielectric material including a top surface and bottom surface, a series of flat lands on the top surface of the body portion for supporting a wafer, and a series of orifices and vacuum lines for drawing a vacuum to secure the wafer in place on the lands of the body portion. A method of manufacturing such a vacuum chuck. A method of aligning a wafer on such a vacuum chuck.

12 Claims, 5 Drawing Sheets

VACUUM CHUCK

FIELD OF INVENTION

This invention relates to a vacuum chuck made of moldable and preferably transparent glass for use in semiconductor wafer processing.

BACKGROUND OF INVENTION

Semiconductor wafer processing plant start-up costs often involve billions of dollars and yet the yield rate for advanced chips can be as low as five percent.

Accordingly, extraordinary efforts have been made to reduce the capital equipment costs and the time and man-hours required to manufacture computer chips. One significant device used in the processing of semiconductor wafers is the vacuum chuck which secures the wafer on a photolithographic stepper machine and other machines. The aluminum chuck includes a top surface with a series of lands which must be machined extremely flat to create the lowest possible focal-plane deviation on the front surface of the wafer. Indeed, numerous expensive and time consuming techniques are used to characterize stepper chuck performance. See Goodall and Alverez, "Characterization of Stepper Chuck Performance".

The problems associated with current aluminum vacuum chucks are many. First is the cost. Due to the complicated and time consuming machining, annealing, and polishing processes to render the chuck surface which engages the wafer as flat as possible and, in addition, due to the machining required to include the necessary vacuum lines, a single aluminum vacuum chuck can cost two to three thousand dollars. Prior art vacuum chucks are typically manufactured by machining aluminum, steel, or ceramic materials. Many of these current vacuum chuck materials are very difficult to machine. And, these prior art chucks require a large number of operations involving annealing, quenching, remachining, anodizing, and other process steps. Some vacuum chuck manufacturing processes have as many as twenty-three individual manufacturing steps often involving the use of corrosive chemicals. Therefore, the manufacturing complexity and the cost of prior art vacuum chucks is extremely high.

A second problem associated with current vacuum chucks relates to their poor mechanical stiffness. After the chucks are mounted in a fixture and during production use, the inherent lack of mechanical stiffness results in deformation of the chuck surface from its original plane of flatness. The result of this surface deformation is the introduction of dimensional tolerance errors in the integrated circuit manufacturing process.

A third problem with prior art vacuum chucks is contamination of the substrate secured to the vacuum chuck. Typical vacuum chucks possess excessive surface area and static forces and gravity cause particles to become attracted and adhered to the vacuum chuck face. When these particles become trapped between the wafer and the chuck face during vacuum clamping, the wafer can be distorted. These distortions result in dimensional shifts in the integrated circuit patterns causing a high rate of rejection of the resulting chips. Contaminating particles also tend to become lodged on the surface of the wafer causing defects and rejected chips. The Goodall paper referred to above also delineates the problems associated with particles being trapped between the wafer and the vacuum chuck. Those skilled in the art have taken extraordinary steps to reduce particle contamination. For example, U.S. Pat. No. 4,551,192, incorporated herein by this reference, discloses a method of manufacturing an electrostatic pin chuck, the complexity of which renders it cost prohibitive.

A fourth problem associated with current vacuum chucks relates to thermal expansion. Typical prior art vacuum chucks are made of materials that are not thermally matched to the silicon wafers. When the ambient temperature in the manufacturing area changes, the vacuum chuck expands or contracts at a rate different than silicon wafer. This causes dimensional shifts in the wafer and contributes to a loss of integrated circuit yield.

A fifth problem associated with prior art vacuum chucks is that they do not facilitate alignment of the wafer with respect to the chuck. Current alignment techniques include the placement of alignment marks on the top surface of the wafer. An alignment system then confirms the location of the alignment mark by directing a beam through the wafer to strike the alignment marks. The semiconductor wafer processing steps, however, result in many layers of films which cover the alignment marks making it difficult for the alignment system to detect their position. This results in alignment overlay errors in integrated circuit manufacturing which is also a source of chip rejection since poor alignment causes the integrated chip patterns to drift outside the acceptable dimensional and therefore electrical limits. One of the inventors of the vacuum chuck of the subject invention devised a photoablation technique to remove the layers of resist covering the alignment marks to improve alignment and the micro-lithographic process. See Burggraaf, Lithography trends, Semiconductor International, December, 1986 (Cahners Publishing Co.). This technique, however, requires specialized equipment and adds to the semiconductor processing time again seriously impacting costs associated with semiconductor wafer processing.

SUMMARY OF INVENTION

It is therefore an object of this invention to provide a new and improved semiconductor wafer vacuum chuck.

It is a further object of this invention to provide such a vacuum chuck which is easier and less expensive to manufacture than prior art vacuum chucks.

It is a further object of this invention to provide such a vacuum chuck which is inherently stiff.

It is a further object of this invention to provide such a vacuum chuck which does not deform during use.

It is a further object of this invention to provide such a vacuum chuck which reduces contamination during wafer processing.

It is a further object of this invention to provide such a vacuum chuck which does not suffer from the thermal expansion problems associated with prior art vacuum chucks.

It is a further object of this invention to provide such a vacuum chuck which facilitates easier alignment of the wafer on the vacuum chuck.

It is a further object of this invention to provide a simpler method of aligning a wafer on a vacuum chuck.

It is a further object of this invention to provide a method of manufacturing a new and improved vacuum chuck.

It is a further object of this invention to provide a new vacuum chuck for semiconductor wafers or other substrates which provides sufficient mechanical stiffness to maintain the wafers on a flat plane across their diameter during vacuum clamping operations.

It is a further object of this invention to provide such a vacuum chuck for semiconductor wafers which is fabricated of a material possessing a coefficient of thermal expansion that closely matches that of typical silicon wafers.

It is a further object of this invention to provide such a vacuum chuck for semiconductor wafers that can be manufactured by a relatively simple process at a relatively low cost.

It is a further object of this invention to provide such a vacuum chuck for semiconductor wafers that can be manufactured out of material that is transparent to most wavelengths of light to thereby facilitate alignment of the wafer on the chuck.

It is a further object of this invention to provide such a vacuum chuck for semiconductor wafers that possess an optimally shaped surface design structure to uniformly distribute the vacuum pressure across the wafer.

It is a further object of this invention to provide such a vacuum chuck which can be molded into special chuck surface configurations.

This invention results from the realization that a less expensive, inherently stiff, and thermally stable vacuum chuck less susceptible to contamination and which can be easily machined into special shapes and to include unique surface configurations and vacuum clamping characteristics is effected by using moldable glass and other dielectric materials to make the vacuum chuck instead of aluminum or other metal alloys and from the further realization that since the vacuum chuck is now transparent, alignment of a wafer on the chuck can be performed by directing an alignment beam through the chuck and then reflected to strike the alignment mark on the back side of the wafer instead of using prior art expensive and time consuming ablation techniques to remove the resist layers covering the alignment marks.

This invention features a vacuum chuck comprising a body portion made of moldable glass including a top surface and bottom surface, a series of flat lands on the top surface of the body portion for supporting a wafer, and means for drawing a vacuum to secure the wafer in place on the lands of the body portion. The lands are preferably concentrically disposed on the top surface. The moldable glass may be pyrex, quartz, or fused silica.

The moldable glass is preferably transparent to make alignment of the water on the chuck easier and a reflective layer may be disposed on the bottom surface of the body portion of the chuck for aligning the wafer with respect to the chuck. The means for drawing a vacuum usually includes a plurality or orifices extending through the body portion between the lands and a plurality of vacuum lines connected to said orifices.

In one embodiment, this invention features a vacuum chuck made entirely of transparent moldable glass and a vacuum chuck made by molding operations instead of machining operations. The method of manufacturing a vacuum chuck in accordance with this invention includes pouring a moldable glass material into a vacuum chuck mold removing the vacuum chuck from the mold and lapping or polishing one surface of the vacuum chuck to the desired flatness.

The method of aligning a wafer on a vacuum chuck in accordance with the subject invention in light of the inherent transparent nature of the glass body of the chuck includes forming alignment marks on the back of the wafer, placing the wafer on a transparent glass vacuum chuck, directing an alignment beam through the transparent glass vacuum chuck, and then redirecting alignment beam to strike the alignment marks on the wafer.

In another embodiment, the vacuum chuck of this invention includes a body portion made of a transparent dielectric material, the body portion including a top surface and a bottom surface; a series of flat lands on the top surface of the body portion for supporting a wafer; and means for drawing a vacuum to secure the wafer in place on the lands of the body portion.

Typical dielectric materials include glass and transparent plastics. The lands may be concentrically disposed on the top surface. A reflective layer is preferably disposed on the bottom surface of the body portion of the chuck for aligning the wafer with respect to the chuck.

Such a vacuum chuck can be manufactured by obtaining a slug of a transparent dielectric material; machining one surface of the slug to include a series of flat lands for supporting a wafer; and polishing or lapping the lands to the desired flatness.

The vacuum chuck of this invention is made of an inherently stiff dielectric material, typically transparent, and having thermal expansion properties which approximately match the thermal expansion properties of substrates to be secured on the vacuum chuck.

DISCLOSURE OF PREFERRED EMBODIMENT

Other objects, features and advantages will occur to those skilled in the art from the following description of a preferred embodiment and the accompanying drawings, in which.

Figure 1:
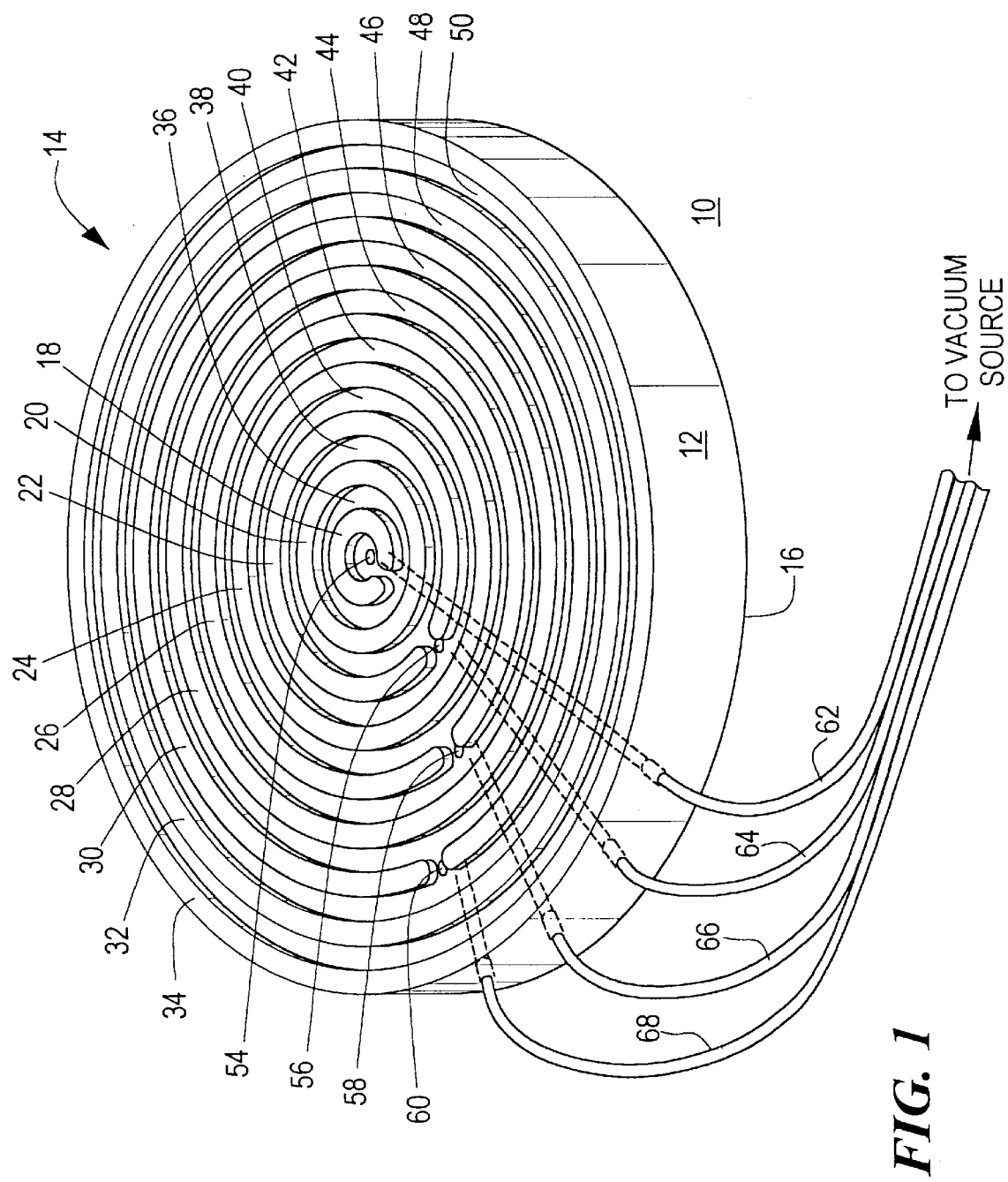
FIG. 1 is a top perspective view of the molded vacuum chuck of the subject invention.

Vacuum chuck 10, FIG. 1 of this invention is preferably composed entirely of moldable transparent glass such as pyrex (80.6% silicon oxide, 3.8% sodium oxide, 0.6% potassium oxide, 0.2% calcium oxide, 2.0% aluminum oxide, 11.9% boron oxide, 0.9% trace elements), quartz, or fused silica. In accordance with the subject invention, many different types of glass may be used but glass materials which are easily moldable, transparent, thermally stable, and inherently rigid should be used. Such a glass vacuum chuck is mechanically stiff, less susceptible to contamination, thermally stable, simple to manufacture, and therefore less expensive than prior art metal vacuum chucks. Glass is also usually inherently transparent thereby facilitating the unique wafer alignment technique of the subject invention discussed below.

Alternatively, the vacuum chuck could be made out of materials other than glass, for example transparent plastic (e.g., acrylics, styrenes) which include many, if not all, of the properties listed above. Other glass materials include soda lime, boro silicate, and fused silica.

Figure 2:
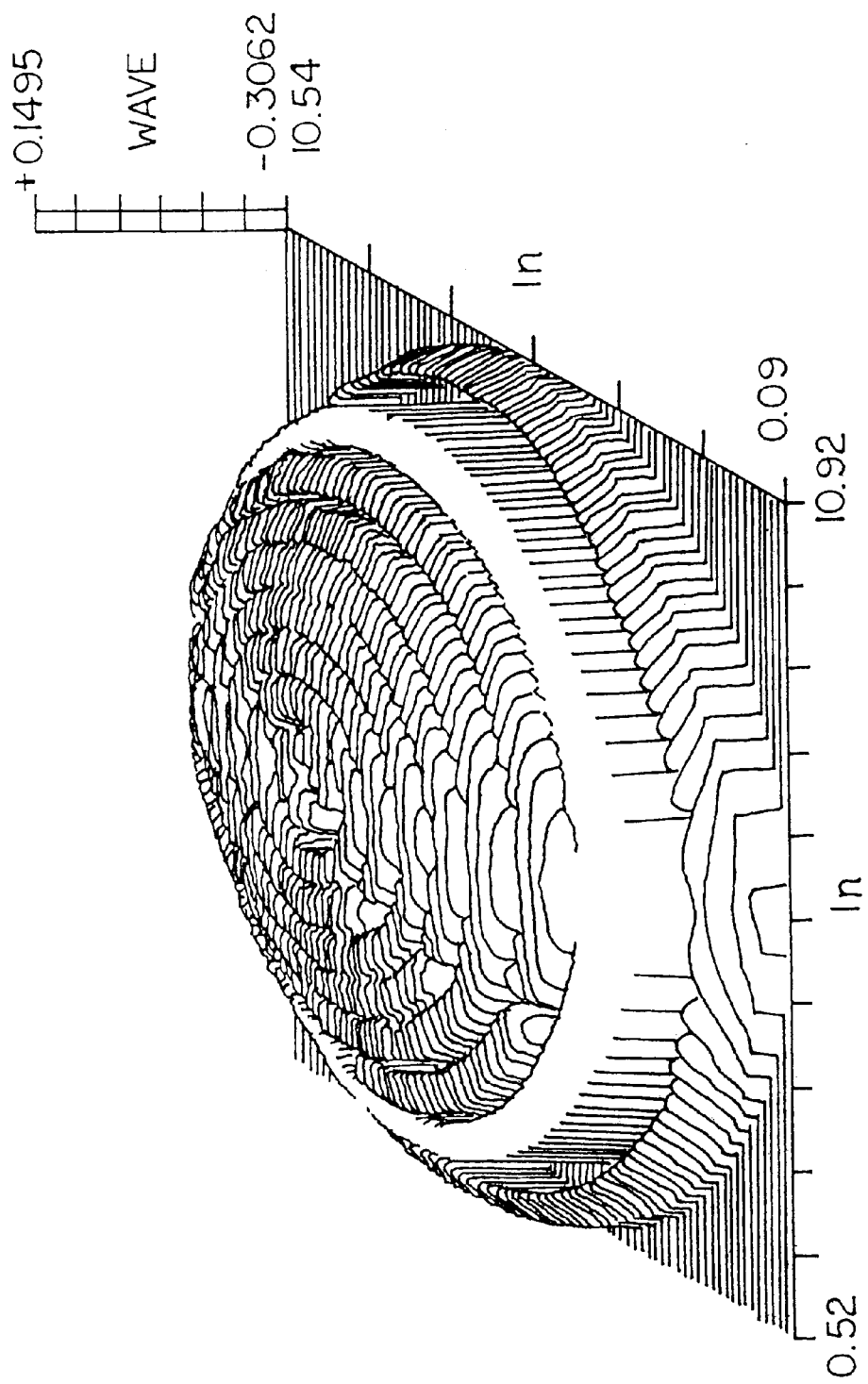
FIG. 2 is a surface flatness map of the vacuum chuck manufactured in accordance with this invention.

Body portion 12 of vacuum chuck 10 defines top surface 14 and bottom surface 16. There are a series of concentric flat lands 18–34 on top surface 16 polished to a flatness of less than 1 μm as shown in FIG. 2. Between each land are a series of concentric trenches 36–50. Lands 18–34 and trenches 36–50 are formed, in this example, by the mold, not by machining. Lands 18–34, when body portion 12 is removed from the mold, typically have a flatness of less than a few microns thereby eliminating many of the machining steps associated with prior aluminum chuck fabrication art. Glass is also inherently stiff and therefore the prior art annealing operations are eliminated in the subject invention resulting in a less expensive vacuum chuck.

There are also means for drawing a vacuum between the series of lands 18–34 to secure the wafer in place on the lands of the body portion. In the preferred embodiment, such means include orifices 54–60 extending through body 12 from bottom surface 16 up to and communicating with trenches 36, 40, 44, and 48 respectively. Each orifice is connected to a vacuum hose as shown, namely vacuum hoses 62, 64, 66, and 68 which extend in a channel machined into bottom surface 16 of chuck body portion 12. When the distal ends of hoses 62 through 68 are connected to a vacuum source, the wafer is secured to lands 18–34.

Chuck 10 is typically round having a diameter of 150 to 300 mm. Lands 18 through 34 are typically one eighth inch wide. Since optical vacuum chuck 10 is made out of stiff glass material, it does not deform from a flat plane as a result of being mounted to the associated photolithographic equipment or deformed during normal handling experienced in production processing. In addition, chuck 10 is fabricated out of an inherently clean and inert material, namely glass, thereby reducing contamination of the wafers during processing. Vacuum chuck 10 has a coefficient of thermal expansion which nearly matches that of the silicon wafer attached to it and therefore vacuum chuck 10 will expand and contract with temperature changes in nearly the same way as the wafer reducing processing errors and increasing chip yield. Since vacuum chuck 10 is made out of moldable glass, it is relatively simple to manufacture and therefore available at a much lower cost than prior art metal vacuum chucks. Because vacuum chuck 10 is molded instead of machined, it is easier to design optimal wafer supporting land configurations to ensure that there is no wafer distortion when vacuum pressure is applied. The concentric ring surface design shown in FIG. 1 allows specific areas of chuck 10 to be addressed with a vacuum resulting in multi-zone chucks. In other embodiments, there can be as many vacuum zones as there are trenches between the support land each controlled by a manifold between the chuck and a vacuum source.

Figure 3:
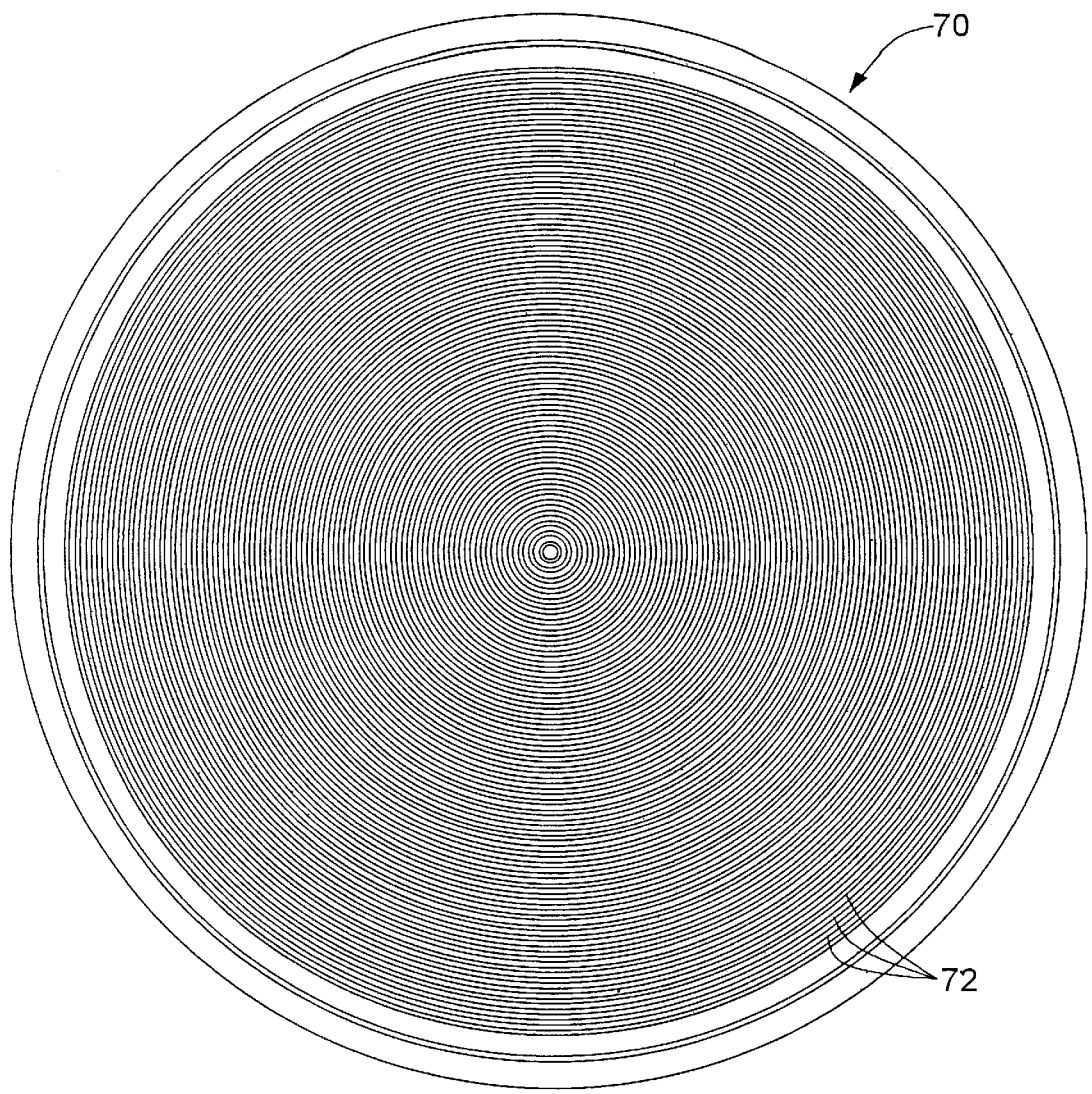
FIG. 3 is a top view of another embodiment of vacuum chuck in accordance with the subject invention.

In another embodiment, ring vacuum chuck 70, FIG. 3 is made by pouring a moldable glass into a round mold without the land forming elements. This 13" diameter "slug blank" is then machined on a circular lathe to form lands 72, FIGS. 3 and 4. Thereafter, the vacuum orifices are machined (e.g. drilled) and vacuum lines are connected to the orifices. Finally, the surface of the lands 72 are lapped or polished. As delineated above, many suitable dialetric materials (e.g., glass, plastic) can be used in the vacuum chuck of this invention by starting with a slug that is machinable to form the wafer supporting lands.

Figure 4:
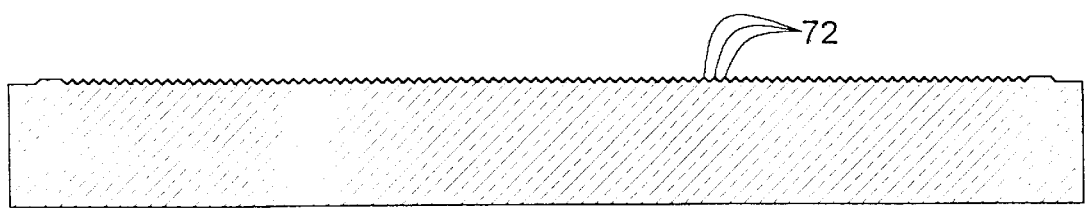
FIG. 4 is a cross sectional view of the vacuum chuck shown in FIG. 3.
Figure 5:
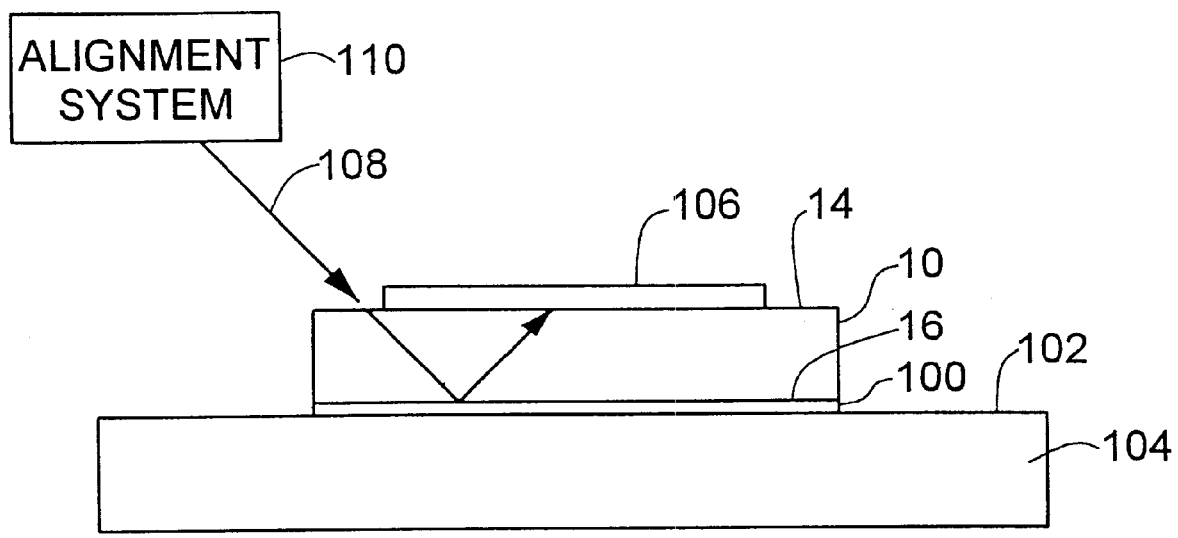
FIG. 5 is a cross sectional view of the vacuum chuck shown in FIG. 1 in place on an X-Y stage and also showing the unique wafer alignment technique of the subject invention.

In the preferred embodiment, chuck 10, FIG. 5 (or chuck 70, FIGS. 3 and 4) is configured to include reflective layer 100 on bottom surface 16 thereof. Alternatively, surface 102 of X-Y stage 104 could be made reflective. Suitable reflective materials include aluminum or chrome in a thin film of approximately 1000 Å. In this way, alignment of wafer 106 with respect to chuck 10 can be easily and conveniently effected by directing alignment beam 108 of alignment system 110 through transparent glass vacuum chuck 10 and redirecting beam 108 via reflective layer 100 to strike alignment marks placed on the back of wafer 106 as shown. If chuck 10, FIG. 1 is made out of quartz or fused silica, the same 248 nanometer laser light used for photolithographic exposure can be used for alignment thereby eliminating the need to account for the dimensional offset of the 633 nm Ag laser light previously used for alignment. In this way, vacuum chuck 10 reduces the cost of semiconductor wafer processing since wafer alignment is easier. The above described alignment method also eliminates the need for expensive and time consuming alignment mark photoresist ablation techniques and the associated equipment as described in the Burggraaf article referred to in the Background to of the Invention above.

Figure 6:
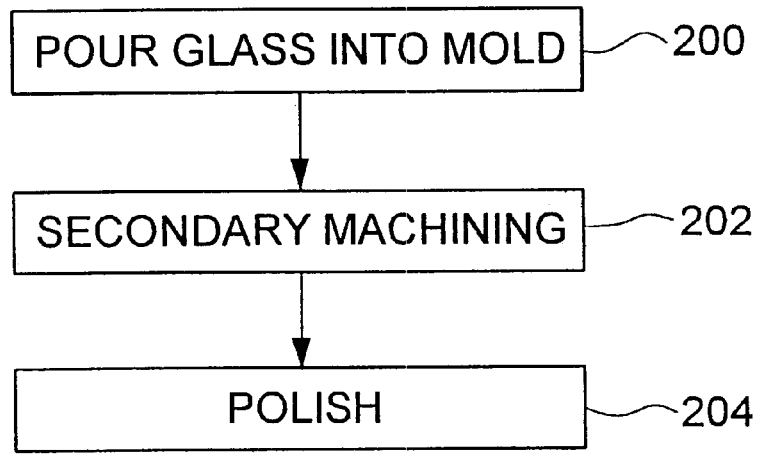
FIG. 6 is a flow chart depicting the primary manufacturing steps associated with the vacuum chuck of the subject invention.

Chuck 10, FIGS. 1 and 5 is cost effective to manufacture because the moldable glass is simply poured in a molten state into a mold, step 200, FIG. 6 which forms lands 18–34 and trenches 36–52, FIG. 1. After the glass hardens, molded body 12, FIG. 1, is removed from the mold and secondary machining operations are completed, step 202, FIG. 6, such as drilling vacuum orifices 54 through 60, FIG. 1. Alternatively, the mold could include members which form vacuum orifices in the mold. Lands 18–34 are then polished or lapped, step 204, FIG. 6. Chuck 70, FIGS. 3 and 4 is formed by obtaining a blank slug of a suitable transparent dialetric material (e.g. glass, plastic), and of a suitable size, step 224, FIG. 8. Next, the lands are machined on a circular lathe, step 226. The vacuum orifices are then machined, step 228 and finally the polishing or lapping operations are completed, step 230. Alternatively, the vacuum orifices could be molded into the blank slug and then the only machining step would be to form the lands.

Figure 7:
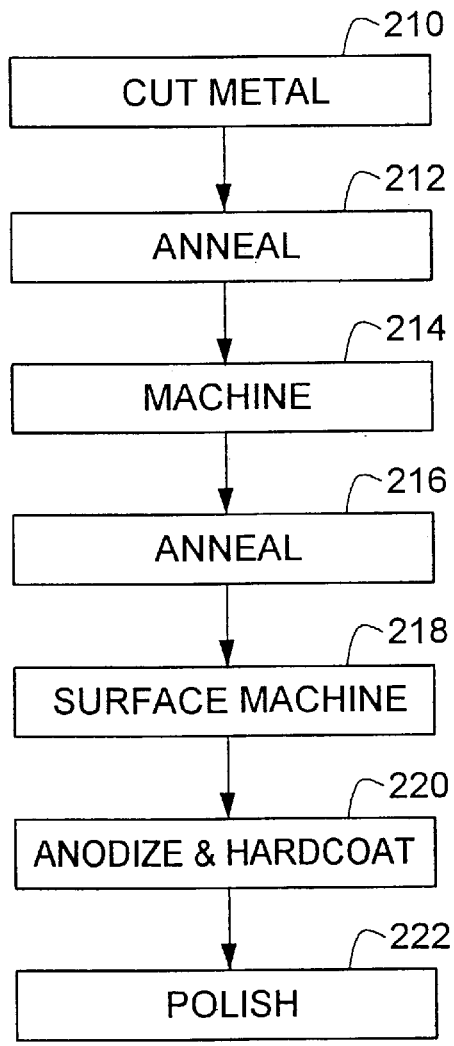
FIG. 7 is a flow chart depicting the processing steps associated with manufacturing prior art vacuum chucks.

The completed chuck typically costs less than one tenth of the price of the prior art aluminum chucks which can run into the thousand of dollars. The reason for this high cost is that prior art aluminum chucks must be cut out of a metal block, step 210, FIG. 7, annealed, step 212, machined 214, annealed again, step 216, surface machined, step 218, anodized and hard coated, step 220, and then polished, step 222. Some vacuum chuck manufacturing processes have as many as twenty three individual manufacturing steps often involving the use of corrosive chemicals.

Figure 8:
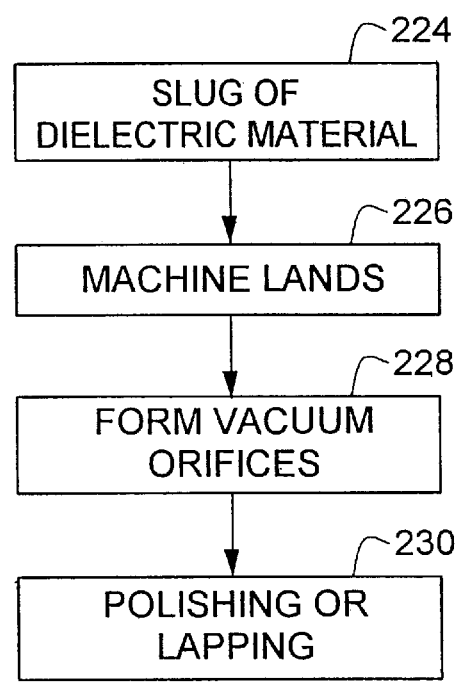
FIG. 8 is a flow chart depicting the primary manufacturing steps associated with another embodiment of the vacuum chuck of the subject invention.

In the subject invention, however, and as shown in FIGS. 6 and 8, most of these manufacturing steps are eliminated. Finally, due to the use of moldable glass or the other dielectric materials in accordance with the subject invention, it is relatively straight forward to design and manufacture special chuck surface configurations and, although FIG. 1 depicts a series of concentric lands, many other land designs are possible by changing the mold used to manufacture the moldable glass vacuum chuck in accordance with this subject invention. In addition, other special chuck surface configurations including irregular concave or convex surfaces under each die site can be implemented in accordance with the subject invention to improve the image transfer function and the printable resolution.

Thus, the subject invention provides a new and improved semiconductor wafer vacuum chuck. Vacuum chucks 10, FIG. 1 or 70, FIG. 3, however, may be used to secure any surface in a flat and stable manner. One example includes polishing optical substrates.

Vacuum chucks 10 and 70 are easier and less expensive to manufacture than prior art vacuum chucks, are inherently stiff, reduce contamination during wafer processing, do not suffer from the thermal expansion problems associated with prior art vacuum chucks, and facilitate easier alignment of the wafer with respect to the vacuum chuck.

The vacuum chucks of this invention are preferably manufactured out of material that is transparent to most wavelengths of light thereby facilitating simpler alignment of semiconductor wafers on the chuck, and is capable of being molded into optimally shaped surface designs to uniformly distribute the vacuum pressure across the wafer. Also, such vacuum chucks can be molded into special chuck surface configurations.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A vacuum chuck comprising:
   a body portion made of moldable glass including a top surface and a bottom surface;
   a series of flat lands on the top surface of the body portion for supporting a wafer;
   a reflective layer on the bottom surface of the body portion for aligning the wafer with respect to the chuck; and
   means for drawing a vacuum to secure the wafer in place on the lands of the body portion.

2. The vacuum chuck of claim 1 in which the lands are concentrically disposed on the top surface.

3. The vacuum chuck of claim 1 in which the moldable glass is pyrex.

4. The vacuum chuck of claim 1 in which the moldable glass is quartz.

5. The vacuum chuck of claim 1 in which the moldable glass is fused silica.

6. The vacuum chuck of claim 1 in which the moldable glass is transparent.

7. The vacuum chuck of claim 1 in which said means for drawing a vacuum includes a plurality of orifices extending through the body portion between the lands and a plurality of vacuum lines connected to said orifices.

8. A vacuum chuck comprising:
   a body portion made of a transparent dielectric material, the body portion including a top surface and a bottom surface;
   a series of flat lands on the top surface of the body portion for supporting a wafer;
   a reflective layer on the bottom surface of the body portion for aligning the wafer with respect to the chuck; and
   means for drawing a vacuum to secure the wafer in place on the lands of the body portion.

9. The vacuum chuck of claim 8 in which the dielectric material is glass.

10. The vacuum chuck of claim 8 in which the dielectric material is plastic.

11. The vacuum chuck of claim 8 in which the lands are concentrically disposed on the top surface.

12. The vacuum chuck of claim 8 in which the dielectric material is transparent.

* * * * *